US005711876A

United States Patent [19]
Lee

[11] Patent Number: 5,711,876
[45] Date of Patent: Jan. 27, 1998

[54] APPARATUS FOR REMOVING BUBBLES IN FILTER HOUSING OF COATING EQUIPMENT

[75] Inventor: Keun Woung Lee, Kyungsangbuk-do, Rep. of Korea

[73] Assignee: L G Semicon Co., Ltd., Chungcheongbuk-do, Rep. of Korea

[21] Appl. No.: 659,523

[22] Filed: Jun. 6, 1996

[30] Foreign Application Priority Data

Feb. 23, 1996 [KR] Rep. of Korea ............ 4295/1996

[51] Int. Cl.$^6$ .................................................. B01D 35/00
[52] U.S. Cl. ........................... 210/436; 210/450; 95/155; 215/307; 215/309; 215/356; 220/373
[58] Field of Search ........................ 118/603, 610; 210/416.1, 258, 436, 450; 95/241; 96/155; 417/313, 385, 383; 215/309, 307, 356; 220/304, 373, 601, 661; 604/324

[56] References Cited

U.S. PATENT DOCUMENTS

| 4,690,621 | 9/1987 | Swain | 210/416.1 |
| 4,915,597 | 4/1990 | Moore | 417/313 |
| 5,167,837 | 12/1992 | Snodgrass et al. | 210/416.1 |
| 5,262,068 | 11/1993 | Bowers et al. | 210/416.1 |

*Primary Examiner*—Laura Edwards
*Attorney, Agent, or Firm*—Morgan, Lewis and Bockius LLP

[57] ABSTRACT

An apparatus for removing bubbles in a filter housing of a coating equipment includes a cover coupled to the filter housing and including a bottom, an inlet portion, an outlet portion, and a drain portion, the bottom of the cover having an inclined surface at an angle, wherein the drain portion is above the inlet portion and the outlet portion on the inclined surface.

10 Claims, 4 Drawing Sheets

APPARATUS FOR REMOVING BUBBLES IN FILTER HOUSING OF COATING EQUIPMENT

BACKGROUND OF THE INVENTION

1. Field of the Invention

The present invention relates to an apparatus in a coating equipment for coating photoresist (PR) on a wafer surface, and more particularly, to an apparatus in a coating equipment for filtering foreign matters contained in the photoresist.

2. Discussion of the Related Art

FIG. 1 is a schematic view of a general coating equipment. This coating equipment includes a sender index 1 for sequentially separating and carrying each individual wafer from a loaded wafer cassette through a series of processes. An adhesion unit 2 exposes and uniformly coats HMDS gas to the wafer surface to enhance the adhesion of the wafer surface with a photoresist. A chill plate 3 cools each wafer to the same temperature as that of the photoresist, in order to enhance the adhesion with the photoresist. A coating unit 4 coats the photoresist onto the surface of the wafer and a hot plate 5 heats the wafer to thereby harden the photoresist coated onto the wafer surface with its solvent evaporated. A receive index 6 sequentially accepts each photoresist-coated wafer into the wafer cassette.

Initially, when a cassette filled with uncoated wafers is loaded on the sender index 1, a start switch button is pressed. A carrier then separates the wafers contained in the cassette one at a time and carries each separated wafer to the adhesion unit 2. When a wafer is carried onto a hot plate (not shown) of the adhesion unit 2, the wafer is adsorbed in vacuum and a supporting cup that was lowered outside the hot plate is raised. Then, the wafer is exposed to the HMDS gas filled in the adhesion unit 2 for a programmed time and the raised cup is lowered. The wafer is then carried to the chill plate 3 to lower its temperature.

After the wafer cools to its initial state temperature, the wafer is carried to the coating unit 4 by a carrier and fixedly adsorbed to a spin chuck. The spin chuck rotates and a photoresist is sprayed through a nozzle onto the wafer. As a result of the rotation of the spin chuck, the photoresist is spread radially by a centrifugal force so that it is uniformly coated on the surface of the wafer. After the photoresist is coated on the wafer surface, the wafer is carried to a hot plate 5 by a carrier for heat treatment. The wafer is heated to a predetermined temperature so that the coated photoresist on the wafer surface becomes hardened with its solvent evaporated.

Finally, the coated wafer is loaded onto a wafer cassette mounted on the receive index 6, thus finishing the photoresist coating process.

The coating unit 4 for coating photoresist on the wafer surface will now be discussed in detail with reference to FIG. 2.

FIG. 2 shows schematically the configuration of a general coating unit 4. This unit includes a container 8 for containing photoresist, a buffer tank 9 for temporarily storing a certain amount of photoresist, a pump 10 for pumping photoresist in the container 8 and the buffer tank 9, a filter housing 11 attached to a drain casing 22 for filtering foreign matters contained in the photoresist, a nozzle 12 for spraying photoresist on the surface of a rotating wafer 7, a pneumatic valve 13 installed between the filter housing 11 and the nozzle 12, and a spin chuck 14 for adsorbing the wafer in vacuum and rotating it at a high speed. The above components are connected to each other through a pipe 15.

When the surface of the wafer 7 is well adsorbed to the photoresist in the adhesion unit 2 and the chill plate 3, the wafer is carried to the spin chuck 14 to be adsorbed thereto in vacuum. Thereafter, the spin chuck 14 rotates and the filtered photoresist (which becomes completely free from foreign matter after passing the filter housing 11 and the pump 10) is sprayed onto the wafer 7 through the nozzle 12 to uniformly coat the photoresist on the surface of the wafer.

Within the coating unit 4, bubbles may be produced in the photoresist due to several factors, such as replacement of the container 8, pumping force of the pump 10, and the loose connection of the pipe 15. These bubbles must be removed completely from the filter housing 11 in order to enhance the yield of wafers.

The replacement of the container 8 may produce bubbles in the photoresist. When the amount of photoresist in the container 8 is below a predetermined amount, a message is transmitted to a worker. He or she then stops the pump 10 and locks a valve (not shown) installed in the buffer tank 9. After the used container 8 is removed, a new container filled with photoresist is substituted. A drain valve (not shown) installed in the buffer tank 9 is opened, and $N_2$ is injected inside the new container 8. This allows air remaining in a tube fixed to the pipe 15 and a cover of the container 8 to escape through the drain valve. However, if the worker locks the drain valve of the buffer tank 9 before the air in the pipe 15 and the tube is completely removed through the buffer tank 9, the remaining air produces bubbles when photoresist is supplied through the pipe 15. Moreover, fine bubbles are produced in the pipe 15 because photoresist is carried by the pressure of the pump 10.

Furthermore, since the respective components are connected by the pipe 15, if O-rings for sealing various connections cannot maintain perfect airtightness, external air may be introduced through such gaps. This also produces bubbles.

A conventional filter housing will now be described in detail referring to FIGS. 3 and 4. FIG. 3 is an exploded perspective view of a conventional filter housing, and FIG. 4 is a vertical sectional view of the filter housing of FIG. 3 in its assembled state.

A bellows-shaped filter 16 is inside the filter housing 11 for filtering foreign matters contained in the photoresist. A cover 17 is fastened to the filter housing 11 by twisting in the cover 17 into the threaded housing.

On the cover 17, an inlet hole 18 is formed for introducing the pre-filtered photoresist, an outlet hole 19 is for discharging the filtered photoresist to the nozzle 12, and a drain hole 20 is for discharging bubbles contained the photoresist. An O-ring 21 is installed at the bottom of the cover 17 in order to maintain airtightness with the filter housing 11.

As shown in FIG. 2, while the wafer 7 is adsorbed to the spin chuck 14, the pump 10 is driven between the buffer tank 9 and the filter housing 11. After the photoresist contained in the buffer tank 9 passes through the filter housing 11, the foreign matters contained therein are removed. The filtered photoresist is then sprayed onto the center of the rotating wafer through the nozzle 12 so that the photoresist is coated on the wafer surface.

Thus, when the photoresist is coated on the wafer surface, photoresist is induced into the filter housing 11 through the inlet hole 18 and bubbles contained in the photoresist are discharged through the drain hole 20 to the drain casing 22.

Moreover, conventional filter housing 11 has the following problems. The housing is made in such a manner that the bottom of the cover 17 is on a horizontal plane. Consequently, if bubbles are produced in other components such as in front of the filter housing and then introduced into the filter housing 11, the bubbles cannot be discharged rapidly to the drain casing 22 through the drain hole 20 because the inlet hole 18, the outlet hole 19, and the drain hole 20 lie on the same horizontal plane.

If the bubbles remain in the filter housing 11, the photoresist becomes a gel type after being exposed to air bubbles. The gel type photoresist is then sprayed through the nozzle 12, causing the photoresist to be unevenly coated on the wafer.

If the bubbles are discharged with the photoresist through the outlet hole 19, particles are formed within the photoresist. This also causes the photoresist to be coated unevenly on the wafer.

SUMMARY OF THE INVENTION

Accordingly, the present invention is directed to an apparatus for removing bubbles in a filter housing that substantially obviates one or more of the problems due to limitations and disadvantages of the related art.

An object of the present invention is to provide an apparatus for removing bubbles in a filter housing more rapidly and more efficiently than the conventional apparatus.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the invention, as embodied and broadly described, an apparatus for removing bubbles in a filter housing of the present invention includes a cover coupled to the filter housing and including a bottom, an inlet portion, an outlet portion, and a drain portion, the bottom of the cover having an inclined surface at an angle, wherein the drain portion is above the inlet portion and the outlet portion on the inclined surface.

In another aspect, an apparatus for removing bubbles contained in a liquid according to the present invention includes a cover having a top surface and an inclined bottom surface, wherein the inclined bottom surface includes an inlet portion having a hole extending to the top surface and located on a first horizontal plane, an outlet portion having a hole extending to the top surface and located on a second horizontal plane, a drain portion having a hole extending to the top surface and located on a third horizontal plane, the third horizontal plane being above the first and the second horizontal planes.

In a further aspect, an apparatus for removing bubbles in a filter housing of a coating equipment includes an inlet hole, outlet hole, and drain hole on a cover coupled to the filter housing by screw-fastening, whereby an inclined surface is formed on the bottom of the cover at a predetermined angle, to allow the inlet and outlet holes to lie on a horizontal line, the drain hole being formed on the inclined hole placed above the inlet hole and outlet hole.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 5:
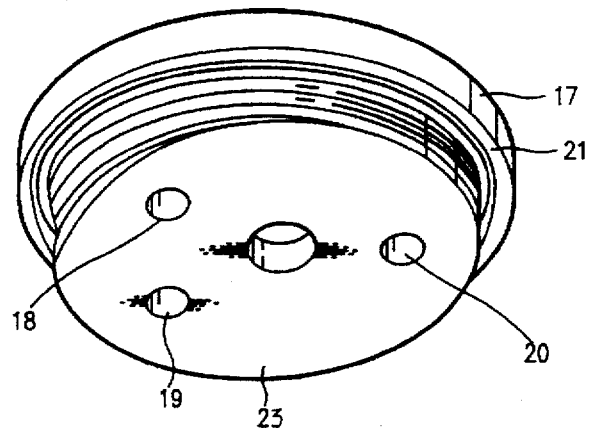
FIG. 5 is a bottom perspective view of an apparatus for removing bubbles in a filter housing in accordance with a first preferred embodiment of the present invention.
Figure 6:
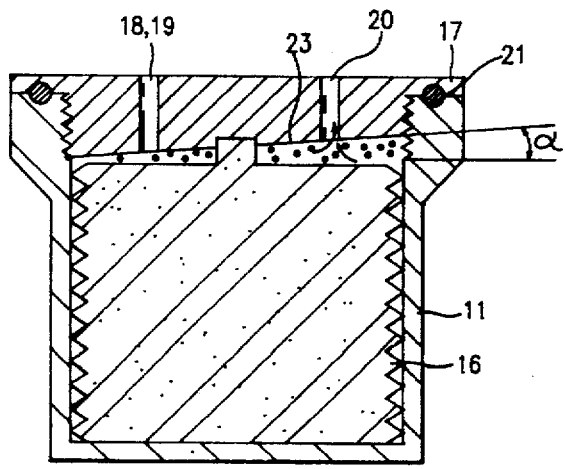
FIG. 6 is a vertical sectional view of the apparatus shown in FIG. 5 when it is coupled to the filter housing.

Referring to FIGS. 5 and 6, a first embodiment of the present invention is constructed so that an inclined surface 23 with a predetermined angle α is formed at the bottom of a cover 17 for a filter housing 11. An inlet hole 18, an outlet hole 19, and a drain hole 20 are also formed on the cover 17. The inlet hole 18 and the outlet hole 19 are formed along a same horizontal plane on the inclined surface 23. The drain hole 20 is formed at a portion of the inclined surface 23 above that of the inlet hole 18 and the outlet hole 19.

The angle α of the inclined surface 23 is preferably within a range of 5°–20°. If the angle α of the inclined surface 23 is less than 5°, the efficiency in removing bubbles present inside the filter housing 11 becomes lower. If the angle α is greater than 20°, the efficiency in removing bubbles is enhanced, but a portion of the cover 17 where the drain hole 20 is located becomes too thin to assure the proper degree of safety.

Figure 7:
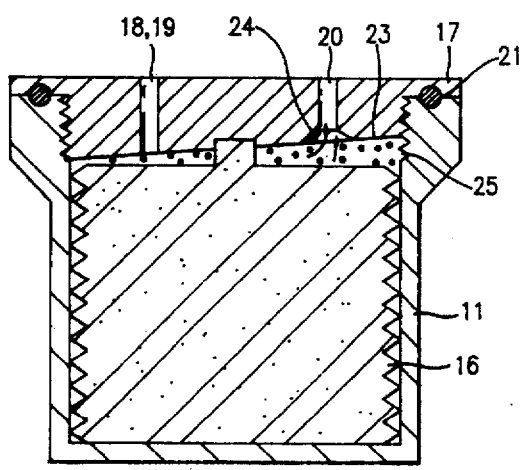
FIG. 7 is a vertical sectional view of a second embodiment of the present invention when it is coupled with the filter housing.

FIG. 7 shows a second embodiment of the present invention. A trumpet-shaped portion 24 is formed on the lower end of the drain hole 20. This enables a more rapid draining of bubbles due to a pressure difference caused by the trumpet-shaped portion 24 when bubbles within the filter housing 11 are drained into a drain casing 22 (see FIG. 2) through the drain hole 20.

Figure 1:
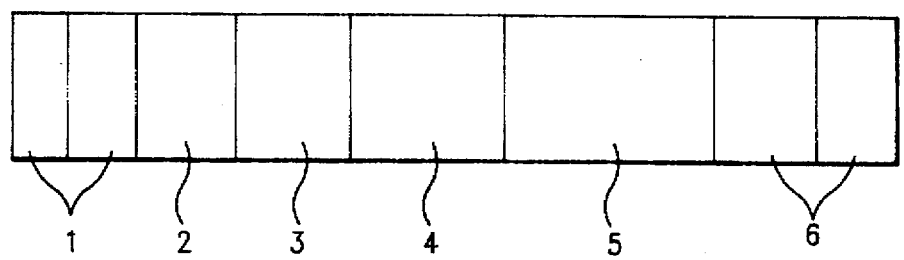
FIG. 1 is a schematic view of a general coating equipment.
Figure 2:
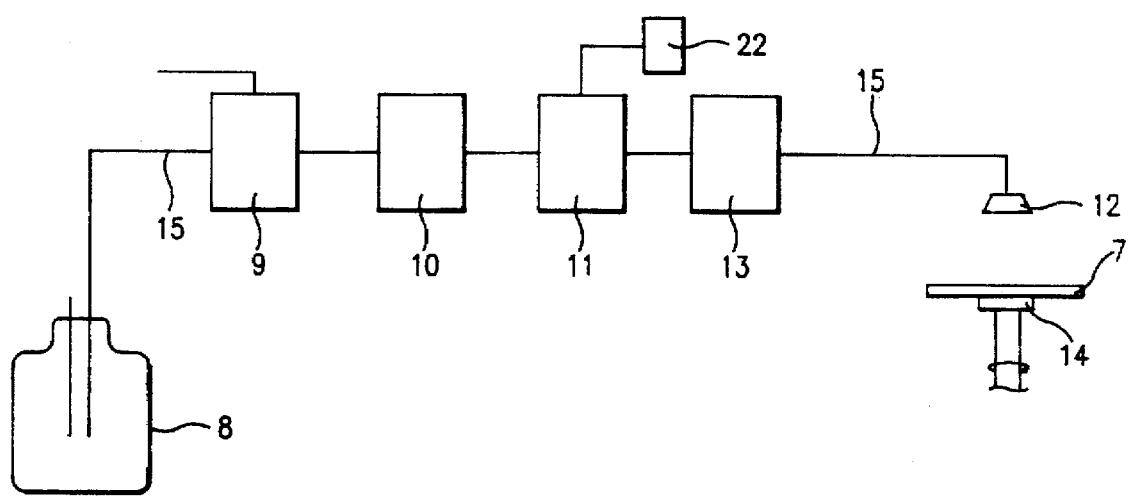
FIG. 2 is a schematic view of a general coating unit.
Figure 3:
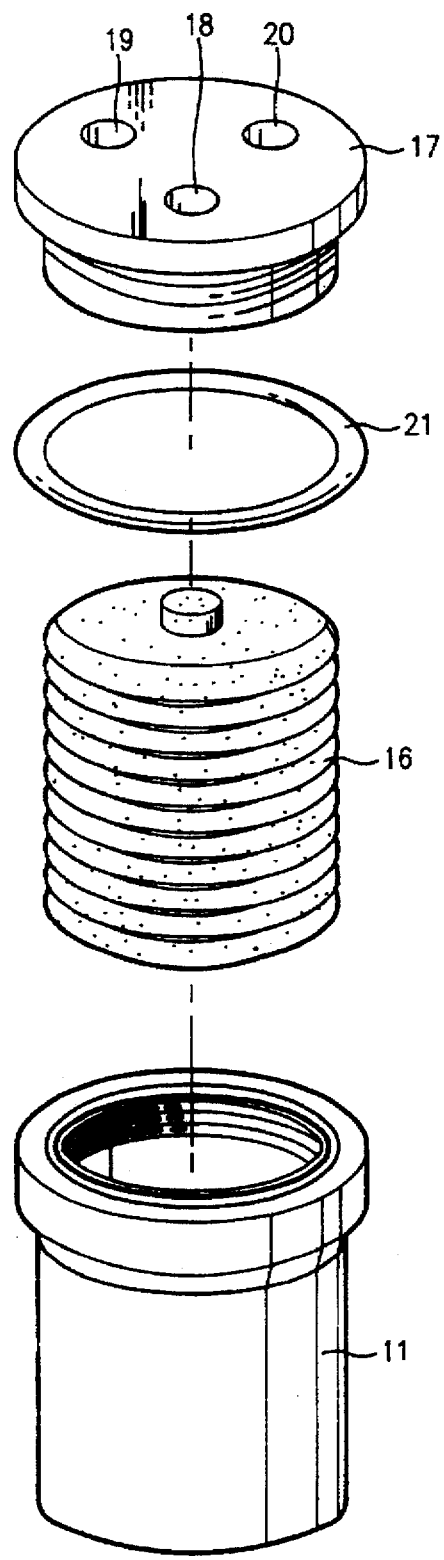
FIG. 3 is an exploded perspective view of a conventional filter housing.
Figure 4:
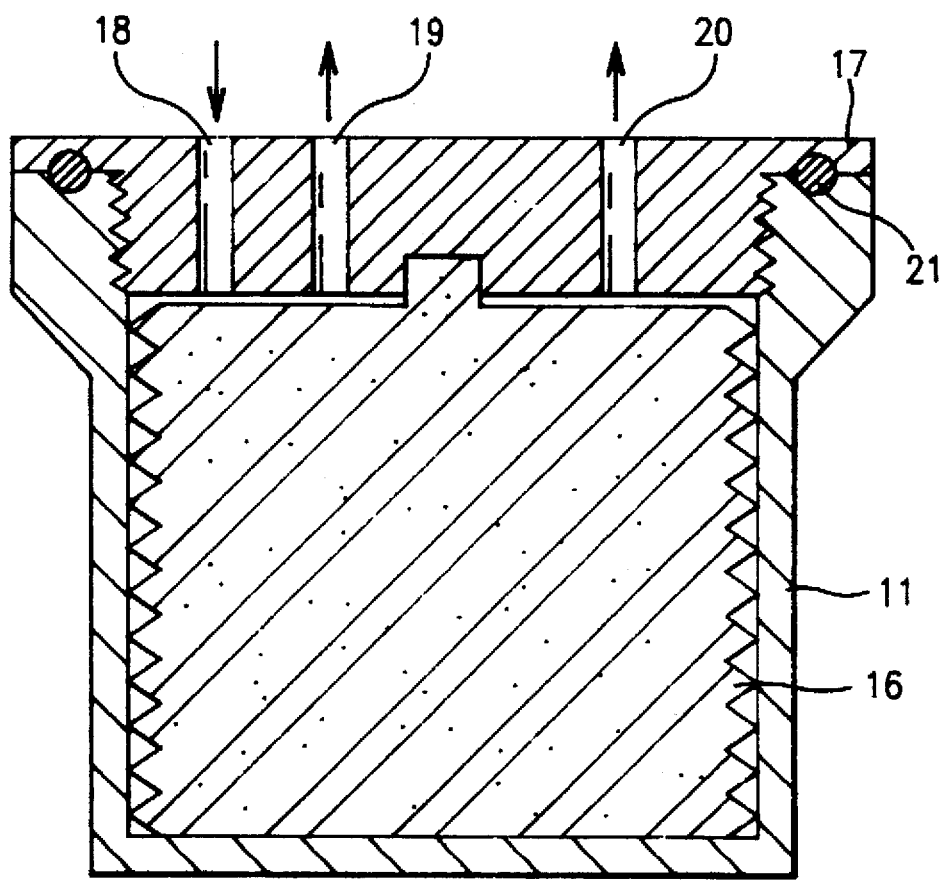
FIG. 4 is a vertical sectional view of the conventional filter housing of FIG. 3 in its assembled state.

The operation and effect of the present invention will now be described referring to FIGS. 1 and 2.

In coating unit 4, a wafer 7 is absorbed to a spin chuck 14 for coating photoresist on the surface of the wafer 7. A pump 10 is driven between a buffer tank 9 and a filter housing 11 so that photoresist contained in the buffer tank 9 passes through the filter housing 11 to remove foreign matters contained in the photoresist. Next, the filtered photoresist is sprayed onto the center of the rotating wafer 17 through a nozzle 12 so that the photoresist is uniformly coated on the surface of the wafer 7.

During this operations, if bubbles are contained in the photoresist which is introduced into the filter housing 11 through an inlet hole 18, the bubbles rapidly moves upward toward a drain hole 20 along an inclined surface 23, as indicated by the arrows in FIGS. 6 and 7. This is due to the pressure difference in the cavity 25 which is formed corresponding to the inclined bottom surface of the cover 17. Then, the bubbles escape through the drain hole 20 to a drain casing 22.

Thus, the bubbles within the filter housing 11 are rapidly discharged through the drain hole 20 placed in the cavity 25 having a wide section, according to the principle that a substance tends to move from a position of higher pressure to a position of lower pressure.

As shown in FIG. 7, when the bubbles in the filter housing 11 are discharged through the drain hole 20 located in a horizontal plane above that of the inlet hole 18 and the outlet hole 19, a trumpet-shaped portion 24 at the lower end of the drain hole 20 will allow the bubbles to be discharged more rapidly. Thus, the second embodiment also supplies the filtered photoresist without the bubbles to the nozzle 12 through the outlet hole 19.

Accordingly, the present invention provides an apparatus for removing bubbles in a filter housing of a coating equipment, in which the structure of a cover for closing the filter housing is improved so that, even if photoresist is introduced inside the filter housing with bubbles contained therein, the bubbles are discharged rapidly through the drain hole.

As described above, the present invention has the following advantages.

First, the bubbles in the filter housing 11 are discharged rapidly through the drain hole 20, thus minimizing the time for the photoresist to make contact with the bubbles. This prevents the photoresist from being exposed to air bubbles and changing into a gel type substance. Second, since the bubbles are not mixed with the photoresist when the photoresist is supplied to the nozzle 12 through the outlet hole 19, particles are prevented from being formed within the photoresist when it is sprayed through the nozzle. Therefore, the photoresist is uniformly coated on the wafer surface. Finally, the bubbles are discharged more rapidly from the filter housing 11 than in the conventional apparatus, thus enhancing both the operability and productivity of the coating equipment.

It will be apparent to those skilled in the art that various modifications and variations can be made in the apparatus for removing bubbles in a filter housing of a coating equipment of the present invention without departing from the spirit or scope of the invention. Thus, it is intended that the present invention cover the modifications and variations of this invention provided they come within the scope of the appended claims and their equivalents.

What is claimed is:

1. An apparatus for removing bubbles in a filter housing of coating equipment, comprising:
   a cover for coupling to the filter housing and including a bottom, an inlet portion, an outlet portion, and a drain portion, the bottom of the cover having an inclined surface at an angle;
   wherein the drain portion is above the inlet portion and the outlet portion on the inclined surface, and wherein the drain portion has asymmetric conical-shaped lower portion and a cylindrical upper portion;
   and wherein the angle of the inclined surface is approximately in a range of 5 to 20 degrees.

2. An apparatus for removing bubbles in a housing comprising:
   a cover having a top surface and an inclined bottom surface, wherein the inclined bottom surface includes:
      an inlet portion having a hole extending to the top surface and located on a first horizontal plane;
      an outlet portion having a hole extending to the top surface and located on a second horizontal plane;
      a drain portion having a hole extending to the top surface and located on a third horizontal plane, the third horizontal plane being above the first and the second horizontal planes, the drain portion for discharging the bubbles from the housing;
   wherein the inclined bottom surface forms an angle with a horizontal surface, the angle being in a range of approximately 5 to 20 degrees.

3. The apparatus as claimed in claim 2, wherein the cover is screw-fastened to the housing.

4. The apparatus as claimed in claim 2, wherein the second horizontal plane and the first horizontal plane are at a same level.

5. The apparatus as claimed in claim 2, wherein the drain portion has a trumpet-shaped lower portion.

6. An apparatus for removing bubbles contained in a liquid, comprising:
   a housing;
   a cover coupled to the housing and having a top surface and an inclined bottom surface, wherein the inclined bottom surface includes:
      an inlet portion having a hole extending to the top surface and located on a first horizontal plane;
      an outlet portion having a hole extending to the top surface and located on a second horizontal plane;
      a drain portion having a hole extending to the top surface and located on a third horizontal plane, the third horizontal plane being above the first and the second horizontal planes, the drain portion for discharging the bubbles from the housing;
   wherein the inclined bottom surface forms an angle with a horizontal surface, the angle being in a range of approximately 5 to 20 degrees.

7. The apparatus as claimed in claim 6, wherein the cover is screw-fastened to the housing.

8. The apparatus as claimed in claim 6, wherein the second horizontal plane and the first horizontal plane are at a same level.

9. The apparatus as claimed in claim 6, wherein the drain portion has trumpet-shaped lower portion.

10. A filter housing of a coating equipment comprising:
    an outer housing;
    a bellows-shaped filter inside the outer housing;
    a cover coupled to the outer housing and having a top surface and an inclined bottom surface; and
    an O-ring between the cover and the outer housing to maintain airtightness;
    wherein the inclined bottom surface includes:
      an inlet portion having a hole extending to the top surface and located on a first horizontal plane;
      an outlet portion having a hole extending to the top surface and located on a second horizontal plane;
      a drain portion having a hole extending to the top surface and a trumpet-shaped lower portion, the drain portion located on a third horizontal plane, the third horizontal plane being above the first and the second horizontal planes, the drain portion for discharging bubbles from the filter housing;
    and wherein the inclined bottom surface forms an angle in a range of approximately 5 to 20 degrees with a horizontal surface.

* * * * *

UNITED STATES PATENT AND TRADEMARK OFFICE
CERTIFICATE OF CORRECTION

PATENT NO. : 5,711,876
DATED : January 27, 1998
INVENTOR(S) : LEE

It is certified that error appears in the above-identified patent and that said Letters Patent is hereby corrected as shown below:

Column 5, Line 60, change "asymmetric" to --a symmetric--.

Column 6, Line 44, after "has" insert --a--;

Line 45, delete "a".

Signed and Sealed this

Twelfth Day of January, 1999

Attest:

Attesting Officer

*Acting Commissioner of Patents and Trademarks*